US011831191B2

United States Patent
Takahashi et al.

(10) Patent No.: US 11,831,191 B2
(45) Date of Patent: Nov. 28, 2023

(54) POWER SUPPLY SYSTEM

(71) Applicant: TOYOTA JIDOSHA KABUSHIKI KAISHA, Toyota (JP)

(72) Inventors: Ryosuke Takahashi, Nagakute (JP); Yuki Sano, Toyota (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 0 days.

(21) Appl. No.: 17/817,455

(22) Filed: Aug. 4, 2022

(65) Prior Publication Data
US 2023/0101070 A1 Mar. 30, 2023

(30) Foreign Application Priority Data

Sep. 27, 2021 (JP) .................. 2021-157221

(51) Int. Cl.
*H02J 7/00* (2006.01)
*G01R 31/36* (2020.01)
*H02J 7/34* (2006.01)
*H02M 1/32* (2007.01)

(52) U.S. Cl.
CPC ...... *H02J 7/00712* (2020.01); *G01R 31/3646* (2019.01); *H02J 7/0048* (2020.01); *H02J 7/342* (2020.01); *H02M 1/32* (2013.01)

(58) Field of Classification Search
None
See application file for complete search history.

(56) References Cited

U.S. PATENT DOCUMENTS

| 2010/0141213 | A1* | 6/2010 | Iida | ............... B60L 50/61 320/134 |
| 2020/0185936 | A1* | 6/2020 | Oishi | ............... H02J 7/0024 |
| 2020/0269699 | A1* | 8/2020 | Nakanishi | ............... B60L 58/18 |

FOREIGN PATENT DOCUMENTS

| JP | 2007-046954 A | 2/2007 |
| JP | 2007-121102 A | 5/2007 |
| JP | 2017-127090 A | 7/2017 |

* cited by examiner

*Primary Examiner* — Jared Fureman
*Assistant Examiner* — Aqeel H Bukhari
(74) *Attorney, Agent, or Firm* — Oblon, McClelland, Maier & Neustadt, L.L.P.

(57) ABSTRACT

A DC-DC converter is connected to an auxiliary battery using a second wire, and the DC-DC converter steps down a voltage and outputs it to the second wire. Plural loads are connected in parallel with the auxiliary battery to the DC-DC converter using plural third wires. A power supply control ECU varies the output voltage of the DC-DC converter and determines a fault range based on the output voltage of the DC-DC converter and a charging/discharging current of the auxiliary battery at that time.

7 Claims, 13 Drawing Sheets

POWER SUPPLY SYSTEM

CROSS-REFERENCE TO RELATED APPLICATION

This application claims priority under 35 USC 119 from Japanese Patent Application No. 2021-157221, filed on Sep. 27, 2021, the disclosure of which is incorporated by reference herein.

BACKGROUND

Technical Field

The present disclosure relates to a power supply system.

Related Art

Japanese Patent Application Laid-open (JP-A) No. 2017-127090 discloses a technology relating to a power supply system that includes a main battery and an auxiliary battery and also includes a DC-DC converter that steps down the output voltage of the main battery. The power supply system includes a load that operates on the output voltage of the auxiliary battery and a power supply wire that is connected to both the load and the auxiliary battery, and the DC-DC converter steps down the output voltage of the main battery in accordance with a voltage command value and outputs it to the power supply wire. The power supply system also includes a voltage detector that detects the voltage of the power supply wire, a current detector that detects the input/output current of the auxiliary battery, and a control device that controls the operation of the DC-DC converter.

The control device in the conventional art lowers the voltage command value from a first voltage to a second voltage when the SoC of the auxiliary battery calculated using the detection value obtained by the current detector is higher than a reference value, and detects an abnormality relating to the DC-DC converter when the SoC is lower than the reference value, even though the DC-DC converter is not in an overload state, and the auxiliary battery is in a discharging state due to the detection current of the current detector. Moreover, at the time when the abnormality is detected, the control device sets the voltage command value to a third voltage higher than the first and second voltages and operates the DC-DC converter, and, when the voltage difference between the detection voltage of the voltage detector and the third voltage during this operation is smaller than a predetermined threshold value, detects the occurrence of a disconnection between the DC-DC converter and the power supply wire.

However, the conventional art does not have the viewpoint of narrowing down the fault range in a case in which plural loads are connected in parallel with the auxiliary battery to the DC-DC converter.

SUMMARY

The present disclosure provides, in a power supply system that includes a DC-DC converter that steps down the output voltage of a battery of a high-voltage system and in which plural loads are connected in parallel with a battery of a low-voltage system to the DC-DC converter, the power supply system that may narrow down a fault range in a circuit including the DC-DC converter and the battery of the low-voltage system connected to the output side thereof.

A first aspect of the disclosure is a power supply system including: a first battery; a second battery having a voltage lower than the first battery; a DC-DC converter electrically connected to the first battery using a first wire, and electrically connected to the second battery using a second wire, the DC-DC converter stepping down and outputting to the second wire the output voltage of the first battery; a plurality of loads that are electrically connected in parallel with the second battery to the DC-DC converter using a plurality of third wires; an output detector that detects an output voltage or an output current of the DC-DC converter; a charging/discharging detector that detects a charging/discharging voltage or a charging/discharging current of the second battery; a varying control section that varies one of the output voltage and the output current of the DC-DC converter; and a determination section that: in a case in which a detection value, obtained by the output detector at a time when one of the output voltage or the output current of the DC-DC converter has been varied by the varying control section, is 0, determines that there is a fault in a range from the DC-DC converter to a converter-side segment of the second wire, which is a segment disposed on the DC-DC converter side of all of the plurality of third wires, and in a case in which the detection value, obtained by the output detector at a time when one of the output voltage or the output current of the DC-DC converter has been varied by the varying control section, is not 0, determines whether or not there is a fault based on a detection result obtained by the charging/discharging detector at the time when the one of the output voltage or the output current of the DC-DC converter has been varied by the varying control section, and, in a case in which it determines that there is a fault, determines a fault range from a range from a segment of the second wire outside the converter-side segment to the second battery.

According to this configuration, the second battery has a lower output voltage than the first battery. The DC-DC converter that is electrically connected to the first battery using the first wire is electrically connected to the second battery using the second wire, and the DC-DC converter steps down and outputs to the second wire the output voltage of the first battery. Furthermore, the plural loads are electrically connected in parallel with the second battery to the DC-DC converter using the plural third wires. Moreover, the output voltage or the output current of the DC-DC converter is detected by the output detector, and the charging/discharging current or the charging/discharging voltage of the second battery is detected by the charging/discharging detector.

Here, the varying control section varies one of the output voltage and the output current of the DC-DC converter. The determination section, when the detection value obtained by the output detector at the time when one of the output voltage and the output current of the DC-DC converter has been varied by the varying control section is 0, determines that there is a fault in the range from the DC-DC converter to the converter-side segment of the second wire that is the segment disposed on the DC-DC converter side of all of the plural third wires, and, when the detection value obtained by the output detector at the time when one of the output voltage and the output current of the DC-DC converter has been varied by the varying control section is not 0, determines whether or not there is a fault based on the detection result obtained by the charging/discharging detector at the time when the one has been varied by the varying control section, and, in a case in which it determines that there is a fault, determines the fault range from the range from the segment of the second wire outside the converter-side segment to the second battery.

In a second aspect of the disclosure, in the first aspect, the DC-DC converter may include a converter abnormality detection section that self-diagnoses whether or not operation of the DC-DC converter itself is normal and generates diagnostic information indicating the diagnostic result, and the determination section, in a case in which the detection value, obtained by the output detector at the time when one of the output voltage or the output current of the DC-DC converter has been varied by the varying control section, is 0, may determine that there is a fault in the DC-DC converter in a case in which the diagnostic information obtained by the converter abnormality detection section is information indicating a fault in the DC-DC converter and otherwise may determine that there is a disconnection fault in the converter-side segment of the second wire.

According to this configuration, the converter abnormality detection section of the DC-DC converter self-diagnoses whether or not operation of the DC-DC converter itself is normal and generates diagnostic information indicating the diagnostic result. When the detection value obtained by the output detector at the time when one of the output voltage and the output current of the DC-DC converter has been varied by the varying control section is 0, the determination section determines that there is a fault in the DC-DC converter in a case in which the diagnostic information obtained by the converter abnormality detection section is information indicating a fault in the DC-DC converter and otherwise determines that there is a disconnection fault in the converter-side segment of the second wire.

In a third aspect of the disclosure, in the first and second aspects, the second battery may include a battery abnormality detection section that self-diagnoses whether or not operation of the second battery itself is normal and generates diagnostic information indicating the diagnostic result, and in a case in which the detection value, obtained by the output detector at the time when one of the output voltage or the output current of the DC-DC converter has been varied by the varying control section, is not 0 and a detection value relating to discharging obtained by the charging/discharging detector at the time when the one of the output voltage or the output current of the DC-DC converter has been varied is outside a predetermined range, the determination section may determine that there is a fault in the second battery in a case in which the diagnostic information obtained by the battery abnormality detection section is information indicating a fault in the second battery and otherwise may determine that there is a disconnection fault in a segment of the second wire located between junctions with the plurality of third wires.

According to this configuration, the battery abnormality detection section of the second battery self-diagnoses whether or not operation of the second battery itself is normal and generates diagnostic information indicating the diagnostic result. When the detection value obtained by the output detector at the time when one of the output voltage and the output current of the DC-DC converter has been varied by the varying control section is not 0 and the detection value relating to discharging obtained by the charging/discharging detector at the time when the one has been varied is outside a predetermined range, the determination section determines that there is a fault in the second battery in a case in which the diagnostic information obtained by the battery abnormality detection section is information indicating a fault in the second battery and otherwise determines that there is a disconnection fault in the segment of the second wire located between the junctions with the plural third wires.

In a fourth aspect of the disclosure, in the above aspects, the second battery may include a battery abnormality detection section that self-diagnoses whether or not operation of the second battery itself is normal and generates diagnostic information indicating the diagnostic result, and in a case in which the detection value, obtained by the output detector at the time when one of the output voltage or the output current of the DC-DC converter has been varied by the varying control section, is not 0 and a detection value relating to charging obtained by the charging/discharging detector at the time when the one of the output voltage or the output current of the DC-DC converter has been varied has not reached a predetermined value, the determination section may determine that there is a fault in the second battery in a case in which the diagnostic information obtained by the battery abnormality detection section is information indicating a fault in the second battery and otherwise may determine that there is a disconnection fault in a segment of the second wire disposed on the second battery side of all of the plurality of third wires.

According to this aspect, the battery abnormality detection section of the second battery self-diagnoses whether or not operation of the second battery itself is normal and generates diagnostic information indicating the diagnostic result. When the detection value obtained by the output detector at the time when one of the output voltage and the output current of the DC-DC converter has been varied by the varying control section is not 0 and the detection value relating to charging obtained by the charging/discharging detector at the time when the one has been varied has not reached a predetermined value, the determination section determines that there is a fault in the second battery in a case in which the diagnostic information obtained by the battery abnormality detection section is information indicating a fault in the second battery and otherwise determines that there is a disconnection fault in the segment of the second wire disposed on the second battery side of all of the plural third wires.

A fifth aspect of the disclosure, in the above aspects, may further include a notification section that may notify a user of information, a residual capacity detection section that may detects the residual capacity of the second battery, and a notification control section that may control the notification section to notify the user of the residual capacity of the second battery detected by the residual capacity detection section in a case in which the detection value, obtained by the output detector at the time when one of the output voltage or the output current of the DC-DC converter has been varied by the varying control section, is 0 and in a case in which the detection value relating to discharging obtained by the charging/discharging detector at the time when the one of the output voltage or the output current of the DC-DC converter has been varied is outside a predetermined range.

According to this aspect, the notification section may notify the user of information, and the residual capacity detection section detects the residual capacity of the second battery. When the detection value obtained by the output detector at the time when one of the output voltage and the output current of the DC-DC converter has been varied by the varying control section is 0 and when the detection value relating to discharging obtained by the charging/discharging detector at the time when the one has been varied is outside a predetermined range, the notification control section controls the notification section to notify the user of the residual capacity of the second battery detected by the residual capacity detection section.

In a sixth aspect of the disclosure, in the above aspects, the varying control section may perform control to increase the output voltage or the output current of the DC-DC converter when the detection value, obtained by the output detector at the time when one of the output voltage or the output current of the DC-DC converter has been varied, is not 0 and the detection value relating to discharging obtained by the charging/discharging detector at the time when the one has been varied is outside a predetermined range.

According to this aspect, when the detection value obtained by the output detector at the time when one of the output voltage and the output current of the DC-DC converter has been varied by the varying control section is not 0 and the detection value relating to discharging obtained by the charging/discharging detector at the time when the one has been varied is outside a predetermined range, the varying control section performs control to increase the output voltage or the output current of the DC-DC converter so that power can be supplied to the loads.

In a seventh aspect of the disclosure, in the above aspects, the varying control section may perform control to increase the output voltage or the output current of the DC-DC converter in a case in which the detection value, obtained by the output detector at the time when one of the output voltage or the output current of the DC-DC converter has been varied, is not 0 and the detection value relating to charging obtained by the charging/discharging detector at the time when the one has been varied has not reached a predetermined value.

According to this aspect, when the detection value obtained by the output detector at the time when one of the output voltage and the output current of the DC-DC converter has been varied by the varying control section is not 0 and the detection value relating to charging obtained by the charging/discharging detector at the time when the one has been varied has not reached a predetermined value, the varying control section performs control to increase the output voltage or the output current of the DC-DC converter so that power can be supplied to the loads.

According to the above aspects, the power supply system of the present disclosure may narrow down, in a power supply system that includes a DC-DC converter that steps down the output voltage of a battery of a high-voltage system and in which plural loads are connected in parallel with a battery of a low-voltage system to the DC-DC converter, a fault range in a circuit including the DC-DC converter and the battery of the low-voltage system connected to the output side thereof.

BRIEF DESCRIPTION OF THE DRAWINGS

Exemplary embodiments will be described in detail based on the following figures, wherein.

DETAILED DESCRIPTION

First Exemplary Embodiment

Figure 1:
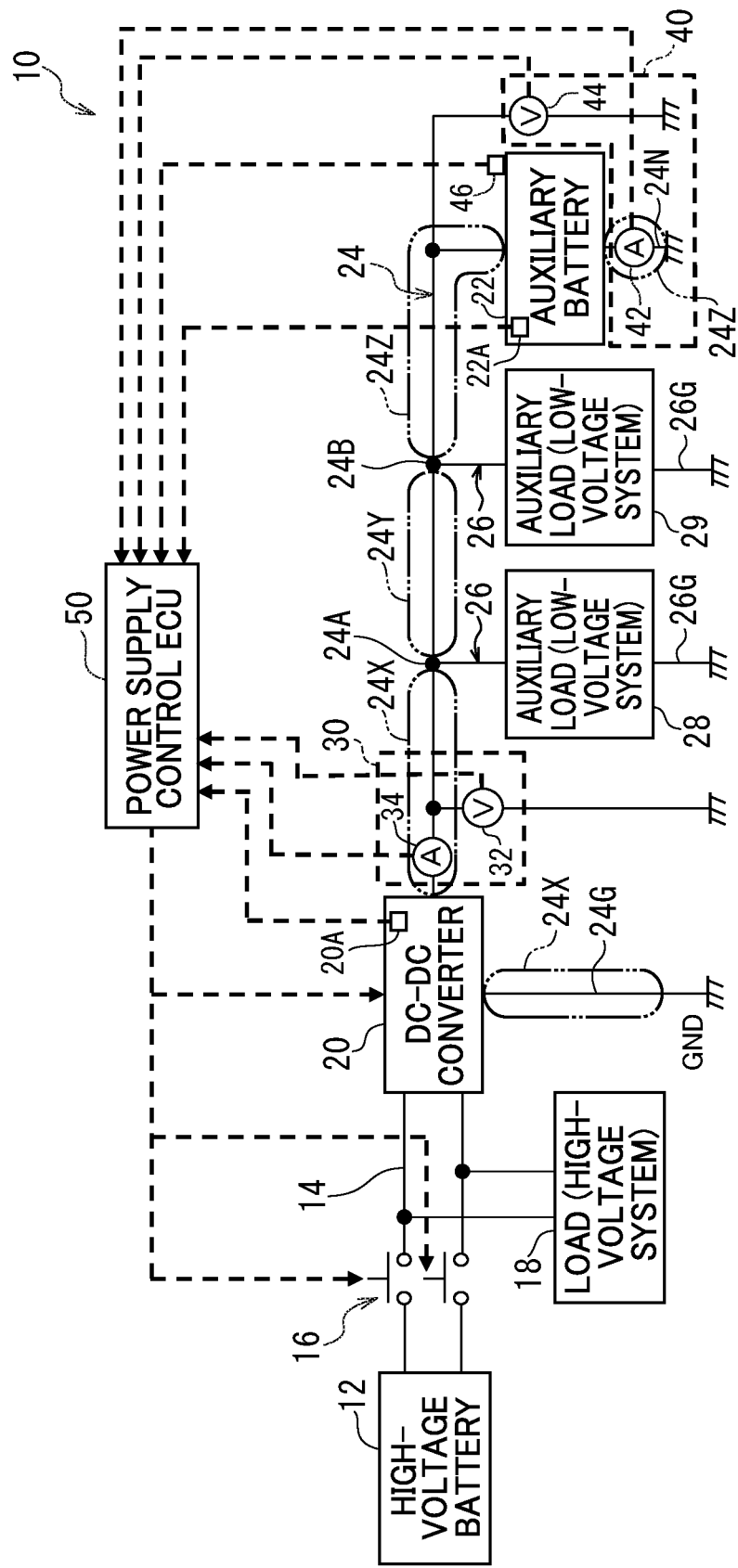
FIG. 1 is a diagram illustrating an example of the schematic configuration of a power supply system pertaining to a first exemplary embodiment.

A power supply system 10 pertaining to a first exemplary embodiment will now be described using FIG. 1 to FIG. 8C. FIG. 1 illustrates an example of the schematic configuration of the power supply system 10 pertaining to the present exemplary embodiment. The power supply system 10 is, as an example, installed in a vehicle.

As illustrated in FIG. 1, the power supply system 10 includes a high-voltage battery 12 serving as a first battery of a high-voltage system, an auxiliary battery 22 serving as a second battery of a low-voltage system whose output voltage is lower than that of the high-voltage battery 12, and a DC-DC converter 20 that is electrically connected to both the high-voltage battery 12 and the auxiliary battery 22. The DC-DC converter 20 is electrically connected to the high-voltage battery 12 using a first wire 14, is electrically connected to the auxiliary battery 22 using a second wire 24, and steps down and outputs to the second wire 24 the output voltage of the high-voltage battery 12. The DC-DC converter 20 is controlled by a power supply electronic control section (ECU) 50 that will be described in detail later.

The DC-DC converter 20 also includes a converter abnormality detection section 20A that self-diagnoses whether or not operation of the DC-DC converter 20 itself is normal and generates diagnostic information indicating the diagnostic result. The diagnostic information generated by the converter abnormality detection section 20A is sent to the power supply control ECU 50.

A system main relay 16 is disposed in the first wire 14. The system main relay 16 is controlled ON and OFF by the power supply control ECU 50. A load 18 is connected to the first wire 14 between the system main relay 16 and the DC-DC converter 20. The load 18 is electrically connected to the high-voltage battery 12 and is connected in parallel with the DC-DC converter 22 to the high-voltage battery 12.

In the low-voltage system to which the power of the voltage stepped down by the DC-DC converter 20 is supplied, auxiliary loads 28 and 29 serving as plural loads are electrically connected in parallel with the auxiliary battery 22 to the DC-DC converter 20 using plural third wires 26. More specifically, a GND wire 24G connected to a negative electrode terminal of the DC-DC converter 20, a GND wire 24N connected to a negative electrode terminal of the auxiliary battery 22, and wire segments 26G of the plural third wires 26 connected to negative electrode terminals of the plural auxiliary loads 28 and 29 are connected to a ground line GND. The second wire 24 and the third wires 26 are constituent parts of a wire harness.

Furthermore, an output voltage sensor 32 serving as an output detector that detects the output voltage of the DC-DC converter 20 and an output current sensor 34 serving as an output detector that detects the output current of the DC-DC converter 20 are connected to the output side of the DC-DC converter 20. A negative electrode side of the output voltage sensor 32 is connected to the ground line GND connected to the negative electrode terminal of the DC-DC converter 20. The output voltage sensor 32 and the output current sensor 34 configure an output-side sensor group 30 and send information indicating their detection results to the power supply control ECU 50.

The auxiliary battery 22 includes a battery abnormality detection section 22A that self-diagnoses whether or not operation of the auxiliary battery 22 itself is normal and generates diagnostic information indicating the diagnostic result. The diagnostic information generated by the battery abnormality detection section 22A is sent to the power supply control ECU 50.

The auxiliary battery 22 is also provided with a residual capacity detection section 46 that detects the residual capacity of the auxiliary battery 22. The residual capacity detection section 46 sends information indicating the result of detecting the residual capacity of the auxiliary battery 22 to the power supply control ECU 50. Furthermore, a charging/discharging current sensor 42 serving as a charging/discharging detector that detects a charging/discharging current of the auxiliary battery 22 and a charging/discharging voltage sensor 44 serving as a charging/discharging detector that detects a charging/discharging voltage of the auxiliary battery 22 are connected to the auxiliary battery 22. Negative electrode sides of the charging/discharging current sensor 42 and the charging/discharging voltage sensor 44 are connected to the ground line GND connected to the negative electrode terminal of the DC-DC converter 20. The charging/discharging current sensor 42 and the charging/discharging voltage sensor 44 configure a charging/discharging sensor group 40 and send information indicating their detection results to the power supply control ECU 50.

Figure 2:
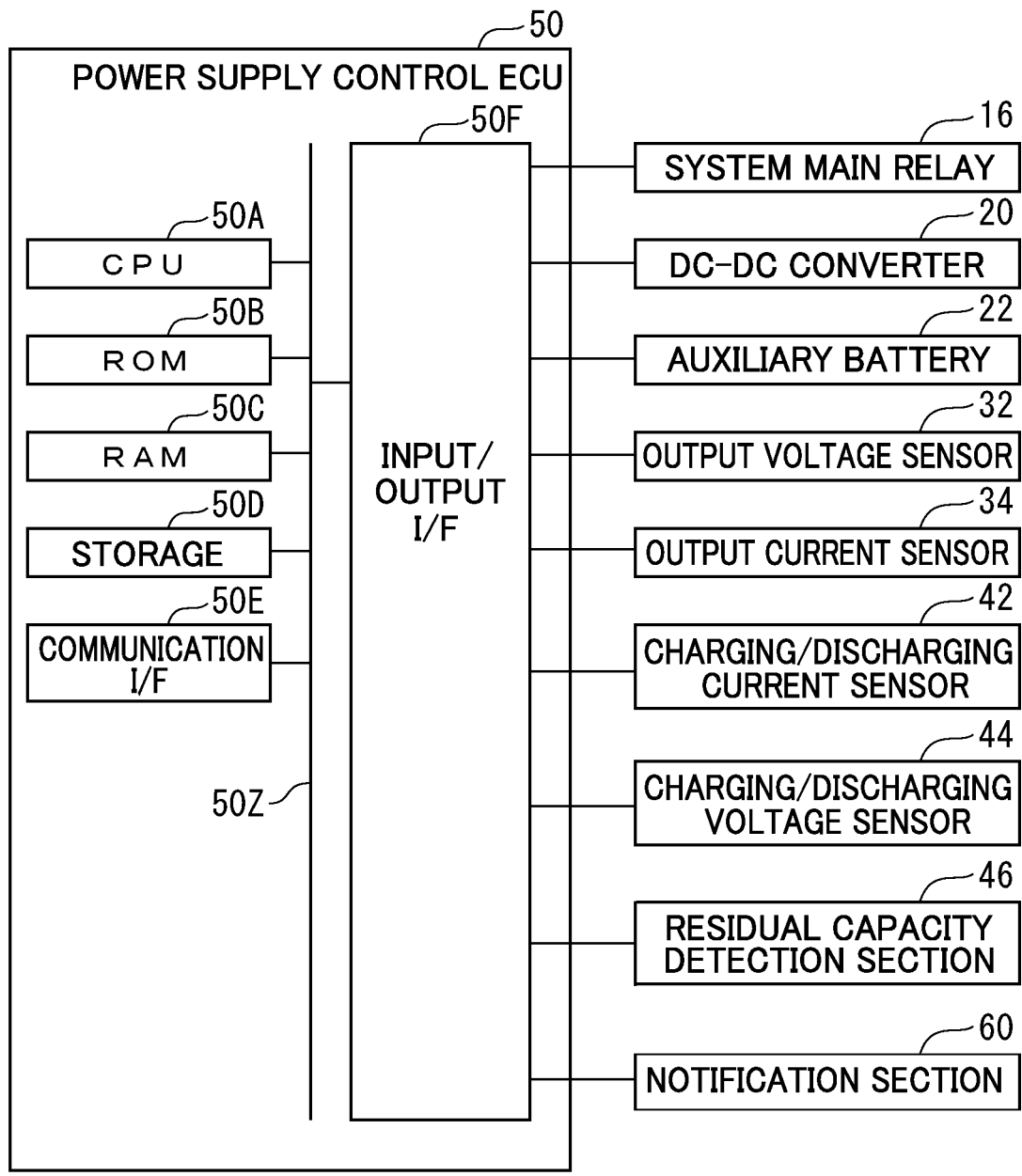
FIG. 2 is a block diagram illustrating an example of hardware configurations of a power supply control ECU and other parts.

In FIG. 2, an example of hardware configurations of the power supply control ECU 50 and other parts is illustrated in a block diagram. As illustrated in FIG. 2, connected to the power supply ECU 50 are the system main relay 16, the DC-DC converter 20, the auxiliary battery 22, the output voltage sensor 32, the output current sensor 34, the charging/discharging current sensor 42, the charging/discharging voltage sensor 44, the residual capacity detection section 46, and a notification section 60. The notification section 60 is configured to be able to notify a user of information and, as an example, is a display provided in the front portion of the cabin of the vehicle.

The power supply control ECU 50 is configured to include a central processing section (CPU; a processor) 50A, a read-only memory (ROM) 50B, a random-access memory (RAM) 50C, a storage 50D, a communication interface (abbreviated as "communication I/F" in FIG. 2) 50E, and an input/output interface (abbreviated as "input/output I/F" in FIG. 2) 50F. The CPU 50A, the ROM 50B, the RAM 50C, the storage 50D, the communication interface 50E, and the input/output interface 50F are communicably connected to each other via a bus 50Z.

The CPU 50A is a central arithmetic processing section, executes various types of programs, and controls each part of the power supply control ECU 50. That is, the CPU 50A reads programs from the ROM 50B or the storage 50D and executes the programs using the RANI 50C as a workspace. The CPU 50A controls each of the above configurations and performs various types of arithmetic processing in accordance with the programs recorded in the ROM 50B or the storage 50D.

The ROM 50B stores various types of programs and various types of data. The RAM 50C temporarily stores programs or data as a workspace. The storage 50D is configured by a storage device such as a hard disk drive (HDD) or a solid-state drive (SSD) and stores various types of programs and various types of data. In the present exemplary embodiment, a power supply control program is stored in the ROM 50B or the storage 50D. The communication interface 50E is an interface for the power supply control ECU 50 to communicate with other devices.

The input/output interface 50F is an interface for communicating with other devices installed in the host vehicle. Connected to the input/output interface 50F of the present exemplary embodiment are, as an example, the system main relay 16, the DC-DC converter 20, the auxiliary battery 22, the output voltage sensor 32, the output current sensor 34, the charging/discharging current sensor 42, the charging/discharging voltage sensor 44, the residual capacity detection section 46, and the notification section 60.

Figure 3:
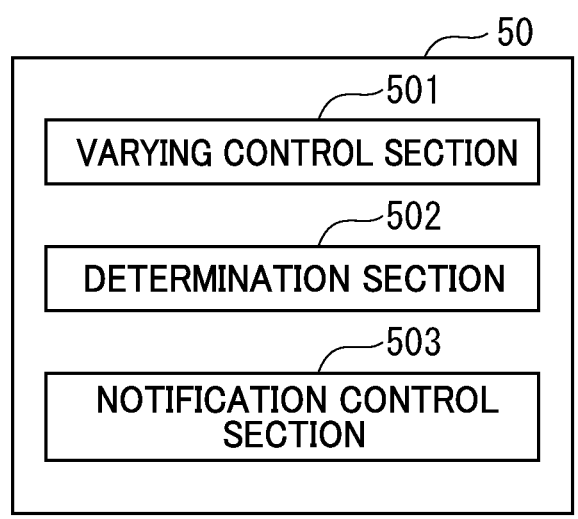
FIG. 3 is a block diagram illustrating an example of functional configurations of the power supply control ECU.

In FIG. 3, an example of functional configurations of the power supply control ECU 50 is illustrated in a block diagram. As illustrated in FIG. 3, the power supply control ECU 50 has, as functional configurations, a varying control section 501, a determination section 502, and a notification control section 503. Each functional configuration is realized by the CPU 50A reading and executing a program (the power supply control program) stored in the ROM 50B or the storage 50D.

The varying control section 501 varies the output voltage of the DC-DC converter 20. Furthermore, the varying control section 501 performs control to increase the output voltage of the DC-DC converter 20 when the detection value obtained by the output voltage sensor 32 at the time when the output voltage of the DC-DC converter 20 has been varied is not 0 and the detection value relating to discharging obtained by the charging/discharging current sensor 42 at the time when the output voltage of the DC-DC converter 20 has been varied is outside a predetermined range. Moreover, the varying control section 501 performs control to increase the output voltage of the DC-DC converter 20 when the detection value obtained by the output voltage sensor 32 at the time when the output voltage of the DC-DC converter 20 has been varied is not 0 and the detection value relating to charging obtained by the charging/discharging current sensor 42 at the time when the output voltage of the DC-DC converter 20 has been varied has not reached a predetermined value.

The determination section 502, when the detection value obtained by the output voltage sensor 32 at the time when the output voltage of the DC-DC converter 20 has been varied by the varying control section 501 is 0, determines that there is a fault in a range from the DC-DC converter 20 to a converter-side segment of the second wire 24 (the segment surrounded by long dashed double-short dashed line 24X in FIG. 1; hereinafter, abbreviated as "the converter-side segment 24X" for convenience) that is a segment disposed on the DC-DC converter 20 side of all of the plural third wires 26. It will be noted that the converter-side segment 24X comprises the segment of the second wire 24 disposed on the DC-DC converter 20 side of junctions 24A and 24B with the third wires 26 and the GND wire 24G of the DC-DC converter 20. Furthermore, the determination section 502, when the detection value obtained by the output voltage sensor 32 at the time when the output voltage of the DC-DC converter 20 has been varied by the varying control section 501 is not 0, determines whether or not there is a fault based on the detection result obtained by the charging/discharging current sensor 42 at the time when the output voltage of the DC-DC converter 20 has been varied by the varying control section 501, and, in a case in which it determines that there is a fault, determines the fault range from a range from the section of the second wire 24 outside the converter-side segment 24X to the auxiliary battery 22.

In the present exemplary embodiment, the determination section 502, when the detection value obtained by the output voltage sensor 32 at the time when the output voltage of the DC-DC converter 20 has been varied by the varying control section 501 is 0, determines that there is a fault in the DC-DC converter 20 in a case in which the diagnostic information obtained by the converter abnormality detection section 20A is information indicating a fault in the DC-DC converter 20 and otherwise determines that there is a disconnection fault in the converter-side segment 24X of the second wire 24.

Furthermore, the determination section 502, when the detection value obtained by the output voltage sensor 32 at the time when the output voltage of the DC-DC converter 20 has been varied by the varying control section 501 is not 0 and the detection value relating to discharging obtained by the charging/discharging current sensor 42 at the time when the output voltage of the DC-DC converter 20 has been varied by the varying control section 501 is outside a predetermined range, determines that there is a fault in the auxiliary battery 22 in a case in which the diagnostic information obtained by the battery abnormality detection section 22A is information indicating a fault in the auxiliary battery 22 and otherwise determines that there is a disconnection fault in a middle segment of the second wire 24 (the segment surrounded by long dashed double-short dashed line 24Y in FIG. 1; hereinafter abbreviated as "the middle segment 24Y" for convenience) that is a segment located between the junctions 24A and 24B with the plural third wires 26.

Moreover, the determination section 502, when the detection value obtained by the output voltage sensor 32 at the time when the output voltage of the DC-DC converter 20 has been varied by the varying control section 501 is not 0 and the detection value relating to charging obtained by the charging/discharging current sensor 42 at the time when the output voltage of the DC-DC converter 20 has been varied by the varying control section 501 has not reached a predetermined value, determines that there is fault in the auxiliary battery 22 in a case in which the diagnostic information obtained by the battery abnormality detection section 22A is information indicating a fault in the auxiliary battery 22 and otherwise determines that there is a disconnection fault in a battery-side segment of the second wire 24 (the segment surrounded by long dashed double-short dashed line 24Z in FIG. 1; hereinafter abbreviated as "the battery-side segment 24Z" for convenience) that is a segment disposed on the auxiliary battery 22 side of all of the plural third wires 26. It will be noted that the battery-side segment 24Z comprises the segment of the second wire 24 disposed on the auxiliary battery 22 side of all of the junctions 24A and 24B with the third wires 26 and the GND wire 24N of the auxiliary battery 22.

The notification control section 503 controls the notification section 60 to notify the user of the residual capacity of the auxiliary battery 22 detected by the residual capacity detection section 46 when the detection value obtained by the output voltage sensor 32 at the time when the output voltage of the DC-DC converter 20 has been varied by the varying control section 501 is 0 and when the detection value relating to discharging obtained by the charging/discharging current sensor 42 at the time when the output voltage of the DC-DC converter 20 has been varied by the varying control section 501 is outside a predetermined range.

Figure 8A:
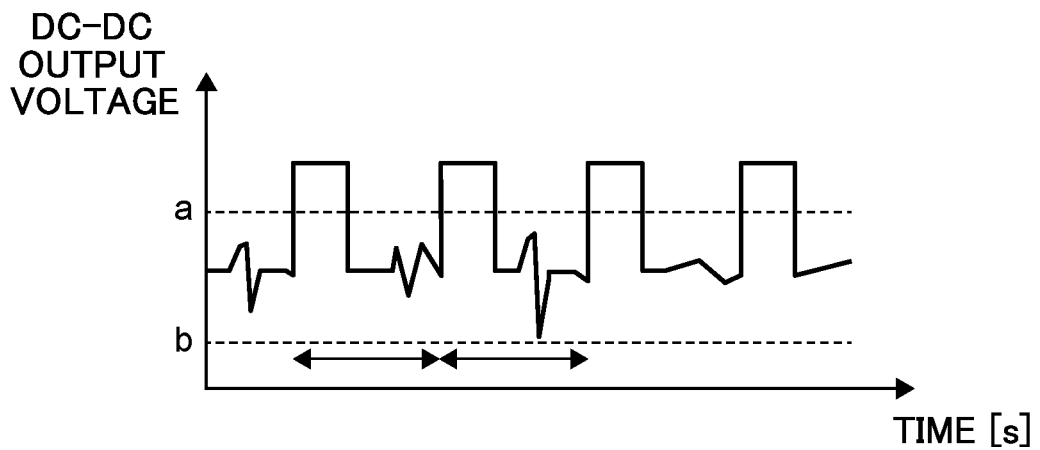
FIG. 8A is a graph illustrating an example of changes in an output voltage of the DC-DC converter during a diagnostic test.

Here, control (control for a diagnostic test) to vary the output voltage of the DC-DC converter 20 will be described with reference to FIG. 8A. In FIG. 8A, the vertical axis represents the output voltage (V) of the DC-DC converter 20 and the horizontal axis represents time (s). As illustrated in FIG. 8A, the output voltage (V) of the DC-DC converter 20 is periodically modulated for a short time (modulated and controlled for the diagnostic test). It will be noted that naturally the parts being modulated for a short time are not float charging control parts. As an example, the DC-DC converter 20 is controlled in such a way that a square-wave pulse voltage is periodically generated. In the present exemplary embodiment, to enhance the accuracy of the disconnection fault range diagnosis, the pulse voltage is set to exceed a predetermined threshold value a. It will be noted that b in the drawing is a lower limit reference value and that the range from b to a in the drawing is to be understood as a float charging control voltage range.

It will be noted that in FIG. 8A the fluctuating parts of the parts outside the square waves are fluctuating parts caused by from load fluctuations (more specifically, float charging parts in which fluctuations occur due to a response lag in the feedback control of the DC-DC converter 20 that makes the charging/discharging current value of the auxiliary battery 22 zero with respect to load changes). Furthermore, in the present exemplary embodiment, as an example, the DC-DC converter 20 periodically generates a square-wave pulse voltage, but considering flickering prevention in a case in which illumination is included in the auxiliary loads and acceptance when the SoC of the power supply rises, the DC-DC converter 20 may also periodically output a voltage having a characteristic waveform other than a square wave, such as a triangular wave or a sine wave, for example. That is, the waveform during the diagnostic test may be any waveform that can be distinguished from the waveform when there are normal load fluctuations.

Next, powered states in cases where a disconnection fault occurs in parts of the converter-side segment 24X, the middle segment 24Y, and the battery-side segment 24Z of the second wire 24 illustrated in FIG. 1 during charging using the DC-DC converter 20 will be described with reference to FIG. 4 to FIG. 6. It will be noted that in FIG. 4 to FIG. 6 the arrows of the thick solid lines show the flow of current.

Figure 4:
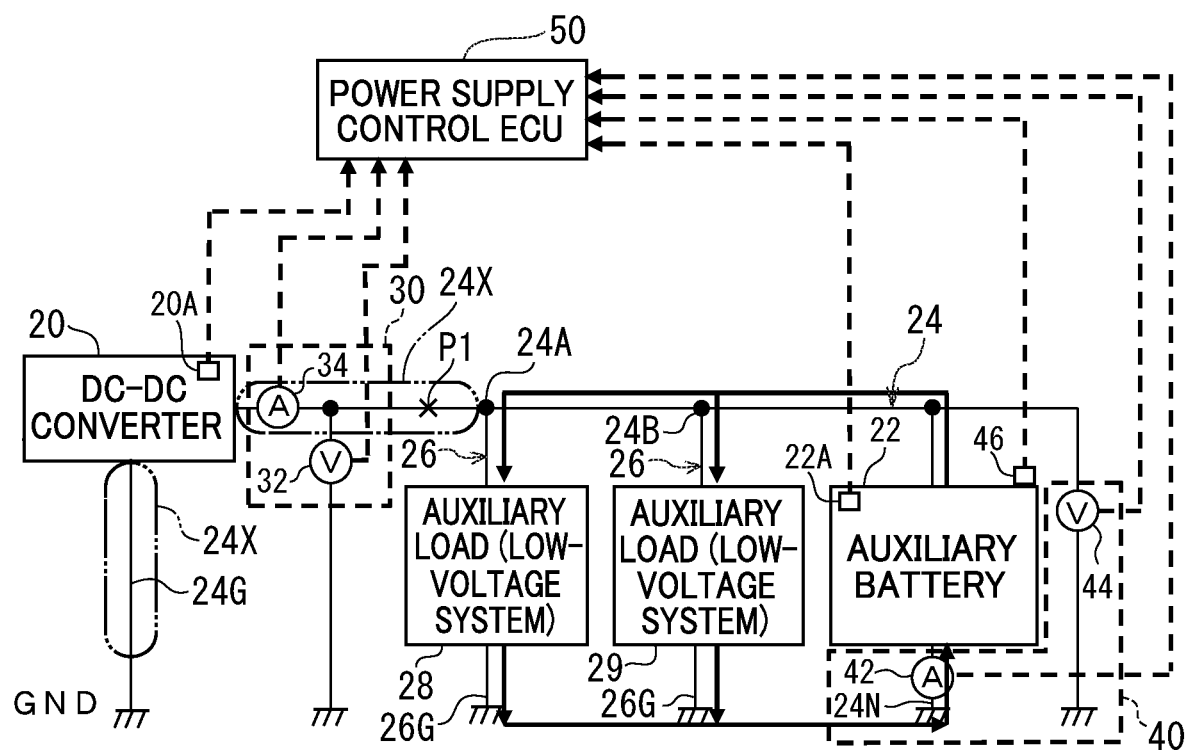
FIG. 4 is a diagram illustrating a powered state in a case in which there is a disconnection fault in a converter-side segment of a second wire during charging using a DC-DC converter.

FIG. 4 illustrates a powered state in a case in which there is a disconnection fault in a part P1 of the converter-side segment 24X of the second wire 24 during charging using the DC-DC converter 20. In a case in which there is a disconnection fault in the part P1 of the converter-side segment 24X of the second wire 24, as illustrated in FIG. 4, power is supplied from the auxiliary battery 22 to the auxiliary loads 28 and 29. Power becomes unable to be supplied from the DC-DC converter 20 to the auxiliary battery 22 and the auxiliary loads 28 and 29.

Figure 5:
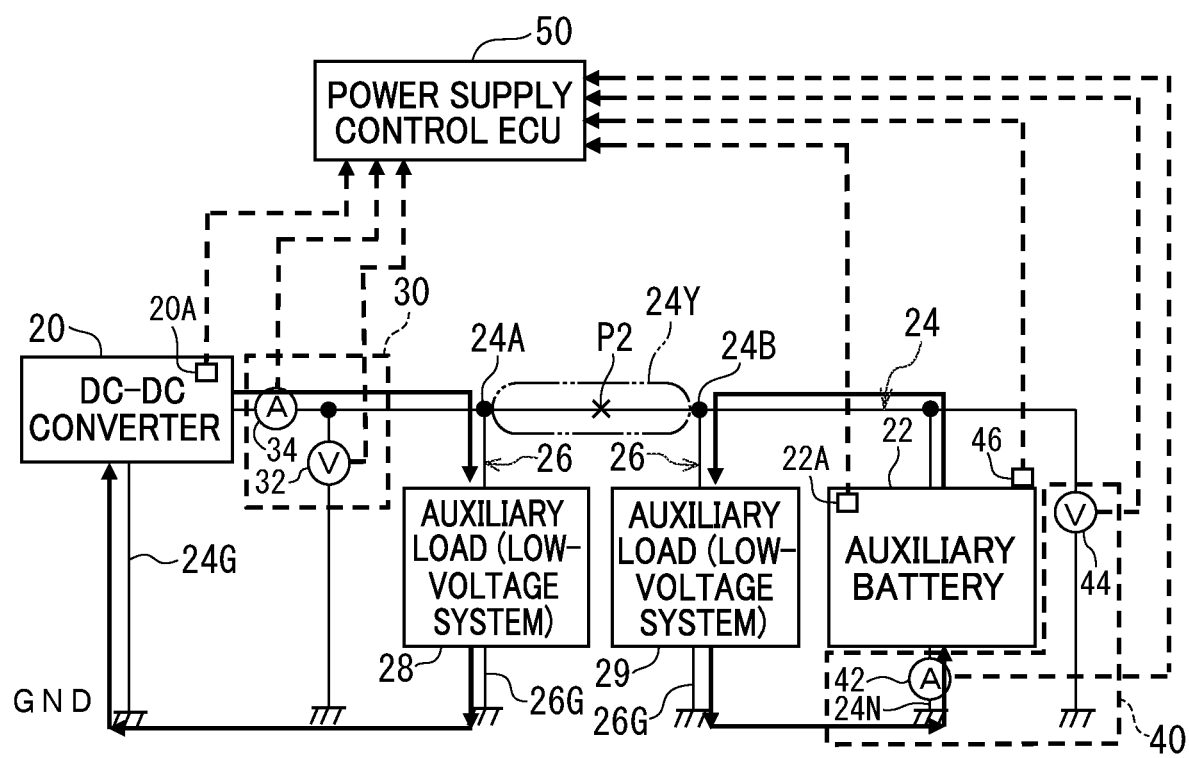
FIG. 5 is a diagram illustrating a powered state in a case in which there is a disconnection fault in a middle segment of the second wire during charging using the DC-DC converter.

FIG. 5 illustrates a powered state in a case in which there is a disconnection fault in a part P2 of the middle segment 24Y of the second wire 24 during charging using the DC-DC converter 20. In a case in which there is a disconnection fault in the part P2 of the middle segment 24Y of the second wire 24, as illustrated in FIG. 5, power is supplied from the DC-DC converter 20 to the auxiliary load 28 and power is supplied from the auxiliary battery 22 to the auxiliary load 29. Furthermore, power becomes unable to be supplied from the DC-DC converter 20 to the auxiliary battery 22.

Figure 6:
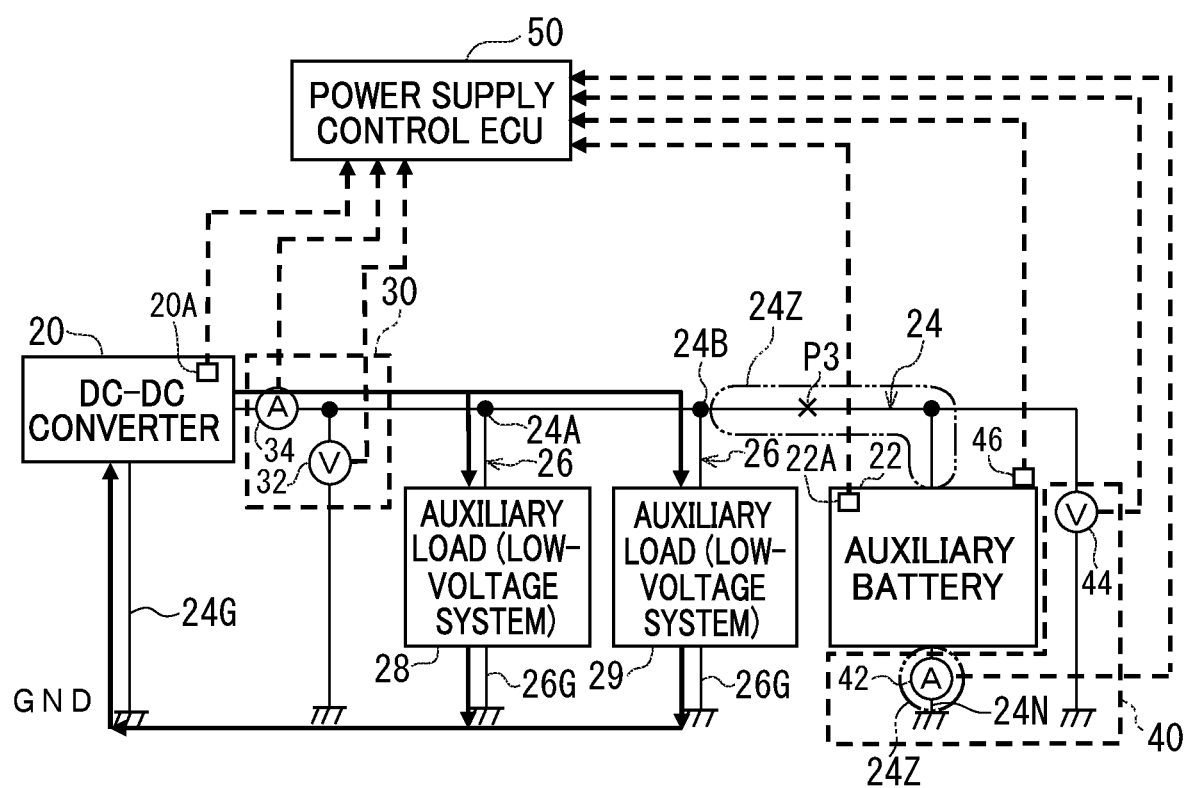
FIG. 6 is a diagram illustrating a powered state in a case in which there is a disconnection fault in a battery-side segment of the second wire during charging using the DC-DC converter.

FIG. 6 illustrates a powered state in a case in which there is a disconnection fault in a part P3 of the battery-side segment 24Z of the second wire 24 during charging using the DC-DC converter 20. In a case in which there is a disconnection fault in the part P3 of the battery-side segment 24Z of the second wire 24, as illustrated in FIG. 6, power is supplied from the DC-DC converter 20 to the auxiliary loads 28 and 29. Furthermore, power becomes unable to be supplied from the DC-DC converter 20 to the auxiliary battery 22.

Next, the action of the power supply system 10 will be described.

Figure 7A:
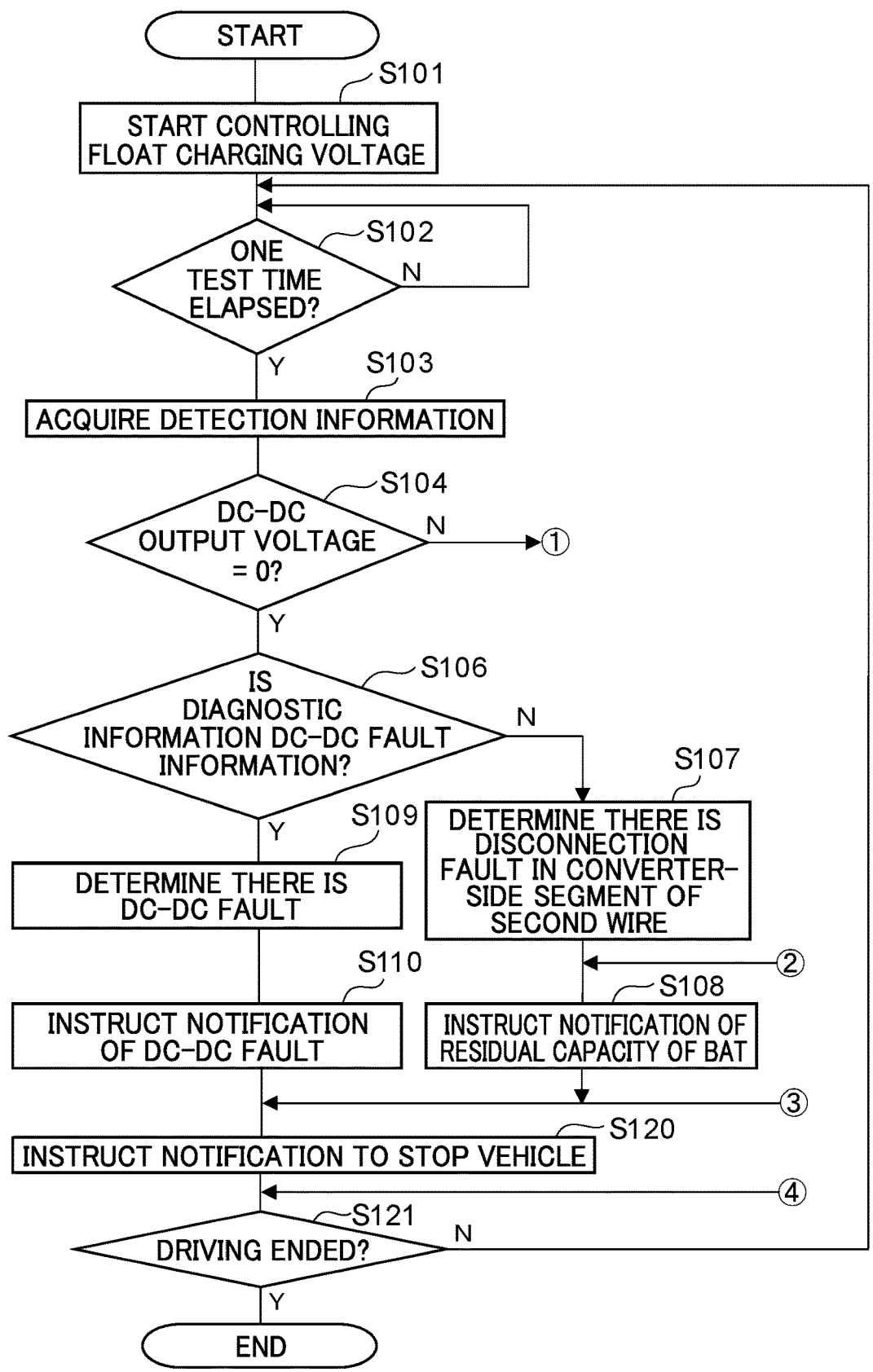
FIG. 7A is a flowchart illustrating an example of a flow of a control process executed by the power supply control ECU.
Figure 7B:
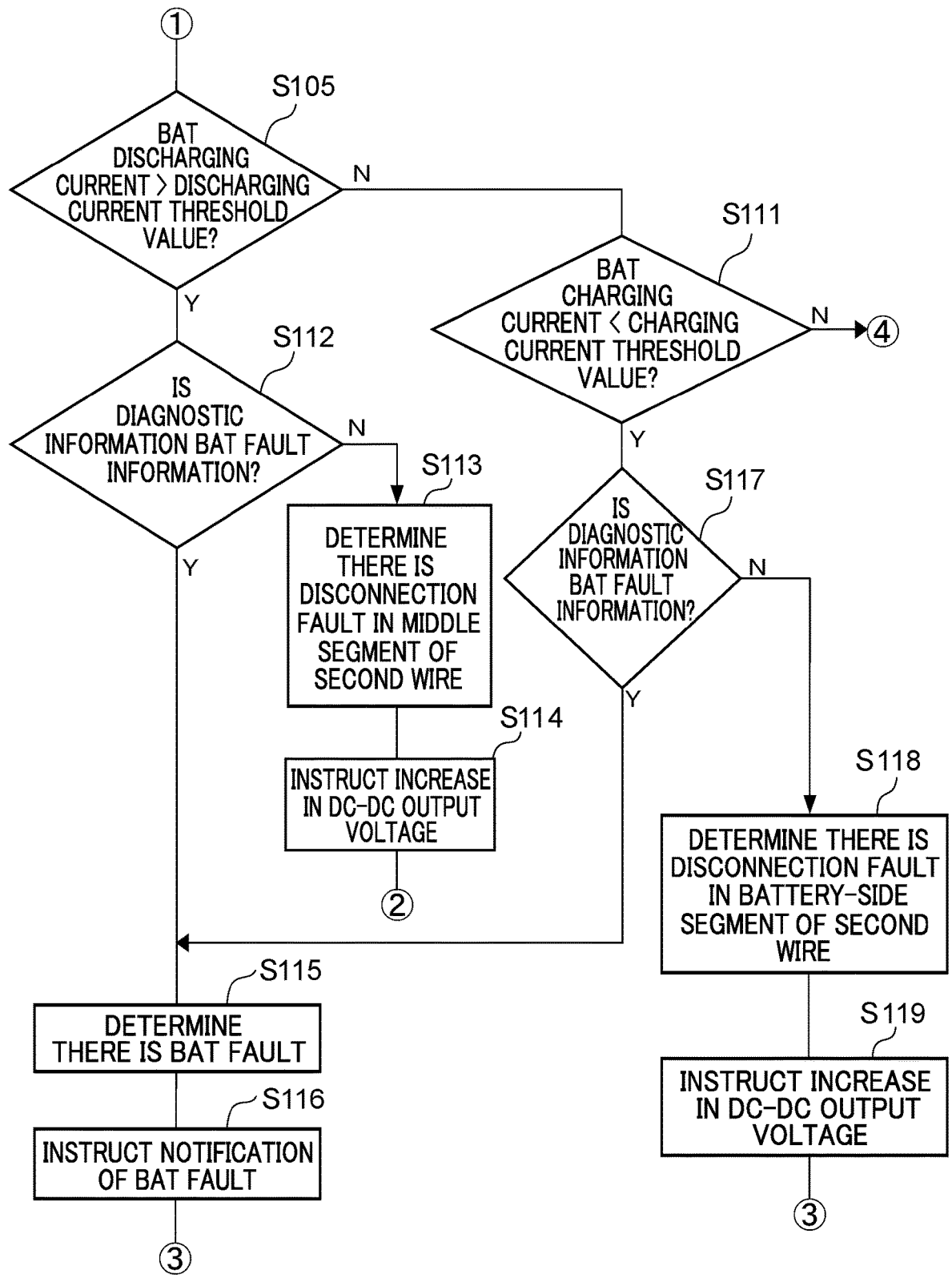
FIG. 7B is a continuation of the flowchart illustrated in FIG. 7A.

In FIG. 7A and FIG. 7B, an example of a flow of a control process executed by the power supply control ECU 50 is illustrated in a flowchart. The control process executed by the power supply control ECU 50 is performed by the CPU 50A reading the power supply control program from the ROM 50B or the storage 50D, transferring it to the RAM 50C, and executing it. Execution of the control process illustrated in FIG. 7A and FIG. 7B is, as an example, started when the ignition switch of the vehicle is switched ON.

Figure 8B:
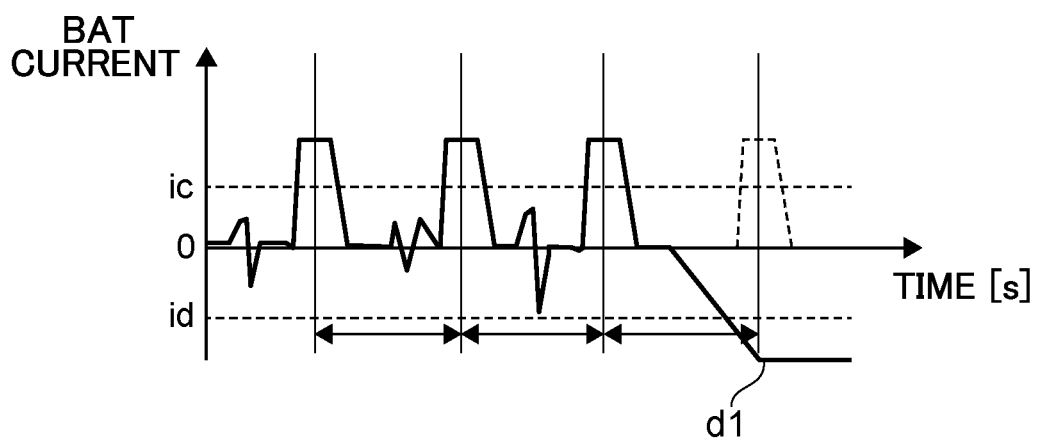
FIG. 8B is a graph illustrating an example of changes in a charging/discharging current of an auxiliary battery during the diagnostic test, with the dashed pulse wave on the right side in the drawing being a waveform in a normal case.
Figure 8C:
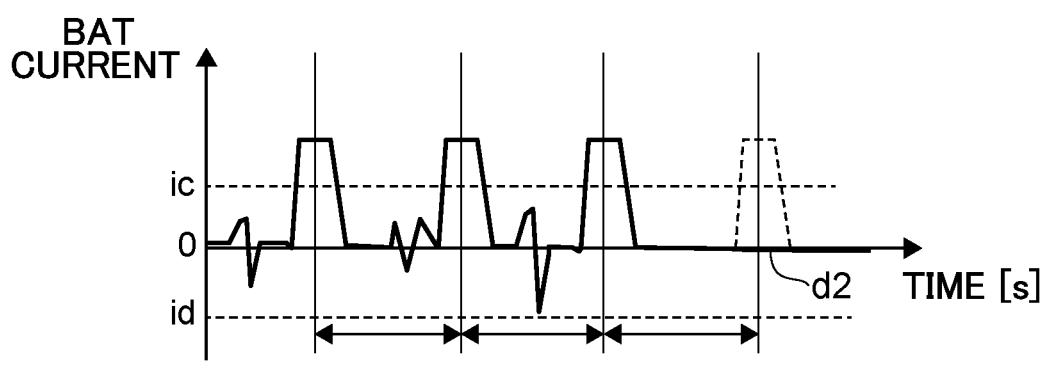
FIG. 8C is a graph illustrating another example of changes in the charging/discharging current of the auxiliary battery during the diagnostic test, with the dashed pulse wave on the right side in the drawing being a waveform in a normal case.

First, the CPU 50A starts controlling the voltage for float charging and periodically modulates the output voltage of the DC-DC converter 20 for a short time (step S101; see FIG. 8A). Next, the CPU 50A determines whether or not one diagnostic test time has elapsed (step S102). FIG. 8B and FIG. 8C are examples of changes in the charging/discharging current value of the auxiliary battery 22 during the diagnostic test. In FIG. 8B and FIG. 8C, the horizontal axis represents time (s) and the vertical axis represents the charging/discharging current value (A) of the auxiliary battery 22. Further regarding the vertical axis, the charging current value becomes greater the higher above 0 it is on the vertical axis, and the absolute value of the discharging current becomes greater the lower below 0 it is on the vertical axis. In the drawings, the double-headed arrows pointing right and left each indicate one diagnostic test time. One diagnostic test time corresponds to one voltage modulation cycle of the DC-DC converter 20 illustrated in FIG. 8A.

Returning to the description of step S102 in FIG. 7A, in a case in which one diagnostic test time has not elapsed (step S102: N), the CPU 50A repeats the process of step S102, and in a case in which one diagnostic test time has elapsed (step S102: Y), the CPU 50A moves to the process of step S103.

In step S103 the CPU 50A acquires information relating to the detection results obtained by, for example, the converter abnormality detection section 20A of the DC-DC converter 20, the battery abnormality detection section 22A of the auxiliary battery 22, the output voltage sensor 32, the output current sensor 34, the residual capacity detection section 46, the charging/discharging current sensor 42, and the charging/discharging voltage sensor 44. That is, the CPU 50A, as an example, acquires the diagnostic information obtained by the converter abnormality detection section 20A and the diagnostic information obtained by the battery abnormality detection section 22A, information relating to the output voltage and the output current of the DC-DC converter 20, and information relating to the residual capacity, the charging/discharging current, and the charging/discharging voltage of the auxiliary battery 22.

Next, the CPU 50A determines whether or not the output voltage of the DC-DC converter 20 is 0 (V) (step S104). In a case in which the output voltage of the DC-DC converter 20 is not 0 (V) (step S104: N), the CPU 50A moves to the process of step S105 (see FIG. 7B). In a case in which the output voltage of the DC-DC converter 20 is 0 (V) (step S104: Y), the CPU 50A moves to the process of step S106.

In step S106 the CPU 50A determines whether or not the diagnostic information obtained by the converter abnormality detection section 20A is information indicating a fault in the DC-DC converter 20. In a case in which the diagnostic information obtained by the converter abnormality detection section 20A is not information indicating a fault in the DC-DC converter 20 (step S106: N), the CPU 50A determines that there is a disconnection fault is the converter-side segment 24X of the second wire 24 and stores the determination result in the storage 50D in step S107, instructs the notification section 160 to notify the user of the residual capacity of the auxiliary battery 22 in step S108, and then moves to the process of step S120 (described later). In a case in which the diagnostic information obtained by the converter abnormality detection section 20A is information indicating a fault in the DC-DC converter 20 (step S106: Y), the CPU 50A determines that there is a fault in the DC-DC converter 20 and stores the determination result in the storage 50D in step S109, instructs the notification section 60 to notify the user that there is a fault in the DC-DC converter 20 in step S110, and then moves to the process of step S120 (described later).

In step S105 illustrated in FIG. 7B, the CPU 50A determines whether or not the absolute value of the discharging current of the auxiliary battery 22 is greater than a discharging current threshold value id (see FIG. 8B and FIG. 8C). It will be noted that the discharging current threshold value id is an absolute value. Furthermore, the discharging current threshold value id is a threshold value of an upper limit of the discharging current in the auxiliary battery 22 during the float charging control of the present exemplary embodiment, and is set based on the control responsiveness of the DC-DC converter 20 and the inrush current of the auxiliary loads 28 and 29.

In a case in which the absolute value of the discharging current of the auxiliary battery 22 is equal to or less than the discharging current threshold value id (step S105: N), the CPU 50A moves to the process of step S111 (described later). In a case in which the absolute value of the discharging current of the auxiliary battery 22 is greater than the discharging current threshold value id (step S105: Y; see the part denoted by reference sign d1 in FIG. 8B), the CPU 50A determines whether or not the diagnostic information obtained by the battery abnormality detection section 22A is information indicating a fault in the auxiliary battery 22 (step S112).

Here, in a case in which the diagnostic information obtained by the battery abnormality detection section 22A is not information indicating a fault in the auxiliary battery 22 and the determination is negative in step S112 (step S112: N), the CPU 50A determines that there is a disconnection fault in the middle segment 24Y of the second wire 24 and stores the determination result in the storage 50D in step S113, ends the float charging control of the DC-DC converter 20 and instructs the DC-DC converter 20 to increase its output voltage so that power can be supplied to the auxiliary load 28 in step S114, and then moves to the process of step S108 (see FIG. 7A). In a case in which the diagnostic information obtained by the battery abnormality detection section 22A is information indicating a fault in the auxiliary battery 22 and the determination is affirmative in step S112 (step S112: Y), the CPU 50A determines that there is a fault in the auxiliary battery 22 and stores the determination result in the storage 50D in step S115, instructs the notification section 60 to notify the user of the fault in the auxiliary battery 22 in step S116, and then moves to the process of step S120 (see FIG. 7A).

In step S111 the CPU 50A determines whether or not the charging current value of the auxiliary battery 22 is less than a charging current threshold value ic (see FIG. 8B and FIG. 8C). It will be noted that the charging current threshold value ic is a threshold value of an upper limit of the charging current in the auxiliary battery 22 during the float charging control of the present exemplary embodiment, and is set based on the control responsiveness of the DC-DC converter 20. The range from the discharging current threshold value id to the charging current threshold value ic illustrated in FIG. 8B and FIG. 8C is to be understood as a float charging control current range. Furthermore, in the present exemplary embodiment, to enhance the accuracy of the disconnection fault diagnosis, the maximum value of the charging current from the DC-DC converter 20 to the auxiliary battery 22 is intentionally made larger than the charging current threshold value ic.

Returning to the description of step S111 in FIG. 7B, in a case in which the charging current value of the auxiliary battery 22 is not less than the charging current threshold value ic (step S111: N), the CPU 50A moves to the process of step S121 (see FIG. 7A). In a case in which the charging current value of the auxiliary battery 22 is less than the charging current threshold value is (step S111: Y; see the part denoted by reference sign d2 in FIG. 8C), the CPU 50A determines whether or not the diagnostic information obtained by the battery abnormality detection section 22A is information indicating a fault in the auxiliary battery 22 (step S117).

Here, in a case in which the diagnostic information obtained by the battery abnormality detection section 22A is not information indicating a fault in the auxiliary battery 22 and the determination is negative in step S117 (step S117: N), the CPU 50A determines that there is a disconnection fault in the battery-side segment 24Z of the second wire 24 and stores the determination result in the storage 50D in step S118, ends the float charging control of the DC-DC converter 20 and instructs the DC-DC converter 20 to increase its output voltage so that power can be supplied to the auxiliary loads 28 and 29 in step S119, and then moves to the process of step S120 (see FIG. 7A). In a case in which the diagnostic information obtained by the battery abnormality detection section 22A is information indicating a fault in the auxiliary battery 22 and the determination is affirmative in step S117 (step S117: Y), the CPU 50A moves to the process of step S115.

In step S120 illustrated in FIG. 7A, the CPU 50A instructs the notification section 60 to notify the user that the vehicle should be stopped. Next, after a predetermined amount of time, the CPU 50A determines whether or not driving of the vehicle has been ended based on, for example, whether or not the ignition switch of the vehicle has been switched OFF (step S121). In a case in which it has been determined that driving has not been ended (step S121: N), the CPU 50A returns to the process of step S102. In a case in which it has been determined that driving has been ended (step S121: Y), the CPU 50A ends the control process illustrated in FIG. 7A and FIG. 7B.

As described above, according to the present exemplary embodiment, a contribution may be made to narrowing down, in the power supply system 10 that includes the DC-DC converter 20 that steps down the output voltage of the high-voltage battery 12 and in which the plural auxiliary loads 28 and 29 are connected in parallel with the auxiliary battery 22 to the DC-DC converter 20, the fault range in the circuit including the DC-DC converter 20 and the auxiliary battery 22 connected to the outside side thereof.

It will be noted that, in the present exemplary embodiment, because the float charging control of the DC-DC converter 20 is only modulated for a short time, deterioration of the auxiliary battery 22 may also be inhibited.

Second Exemplary Embodiment

Next, a second exemplary embodiment will be described using FIG. 9 to FIG. 11B while reusing FIG. 1 and FIG. 2. The power supply system pertaining to the present exemplary embodiment is, except for the points described below, the same as the power supply system 10 of the first exemplary embodiment. Parts that are the same as those of the first exemplary embodiment are assigned the same reference signs, and description of those same parts will be omitted. Furthermore, hardware configurations of the power supply system of the present exemplary embodiment are the same as the hardware configurations of the power supply system of the first exemplary embodiment (see FIG. 1 and FIG. 2), so FIG. 1 and FIG. 2 will be reused, and illustration and detailed description will be omitted.

Figure 9:
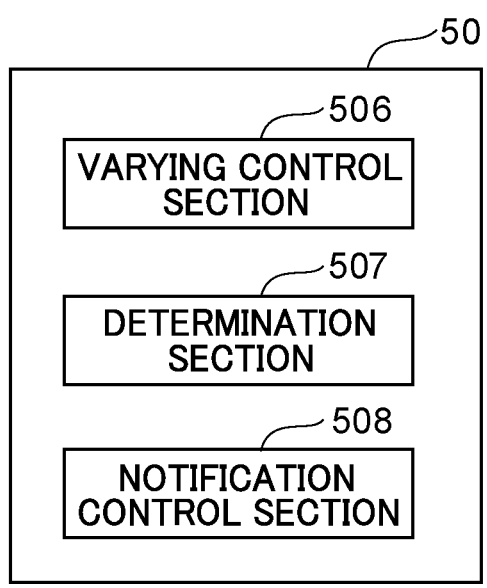
FIG. 9 is a block diagram illustrating an example of functional configurations of the power supply control ECU of a power supply system pertaining to a second exemplary embodiment.

In the ROM 50B or the storage 50D of the power supply ECU 50 of the present exemplary embodiment is stored a power supply control program different from the power supply control program described in the first exemplary embodiment. In FIG. 9, an example of functional configurations of the power supply control ECU 50 of the present exemplary embodiment is illustrated in a block diagram. As illustrated in FIG. 9, the power supply control ECU 50 has, as functional configurations, a varying control section 506, a determination section 507, and a notification control section 508. Each functional configuration is realized by the CPU 50A reading and executing a program (the power supply control program of the present exemplary embodiment) stored in the ROM 50B or the storage 50D.

The varying control section 506 varies the output current of the DC-DC converter 20. Furthermore, the varying control section 506 performs control to increase the output current of the DC-DC converter 20 when the detection value obtained by the output current sensor 34 at the time when the output current of the DC-DC converter 20 has been varied is not 0 and the detection value relating to discharging obtained by the charging/discharging voltage sensor 44 at the time when the output current of the DC-DC converter 20 has been varied is outside a predetermined range. Furthermore, the varying control section 506 performs control to increase the output current of the DC-DC converter 20 when the detection value obtained by the output current sensor 34 at the time when the output current of the DC-DC converter 20 has been varied is not 0 and the detection value relating to charging obtained by the charging/discharging voltage sensor 44 at the time when the output current of the DC-DC converter 20 has been varied has not reached a predetermined value.

The determination section 507, when the detection value obtained by the output current sensor 34 at the time when the output current of the DC-DC converter 20 has been varied by the varying control section 506 is 0, determines that there is a fault in a range from the DC-DC converter 20 to the converter-side segment 24X of the second wire 24 that is a segment disposed on the DC-DC converter 20 side of all of the plural wires 26. Furthermore, the determination section 507, when the detection value obtained by the output current sensor 34 at the time when the output current of the DC-DC converter 20 has been varied by the varying control section 506 is not 0, determines whether or not there is a fault based on the detection result obtained by the charging/discharging voltage sensor 44 at the time when the output current of the DC-DC converter 20 has been varied by the varying control section 506, and, in a case in which it determines that there is a fault, determines the fault range from a range from the segment of the second wire 24 outside the converter-side segment 24X to the auxiliary battery 22.

In the present exemplary embodiment, the determination section 507, when the detection value obtained by the output current sensor 34 at the time when the output current of the DC-DC converter 20 has been varied by the varying control section 506 is 0, determines that there is a fault in the DC-DC converter 20 in a case in which the diagnostic information obtained by the converter abnormality detection section 20A is information indicating a fault in the DC-DC converter 20 and otherwise determines that there is a disconnection fault in the converter-side segment 24X of the second wire 24.

Furthermore, the determination section 507, when the detection value obtained by the output current sensor 34 at the time when the output current of the DC-DC converter 20 has been varied by the varying control section 506 is not 0 and the detection value relating to discharging obtained by the charging/discharging voltage sensor 44 at the time when the output current of the DC-DC converter 20 has been varied by the varying control section 506 is outside a predetermined range, determines that there is a fault in the auxiliary battery 22 in a case in which the diagnostic information obtained by the battery abnormality detection section 22A is information indicating a fault in the auxiliary battery 22 and otherwise determines that there is a disconnection fault in the middle segment 24Y of the second wire 24 that is a segment located between the junctions 24A and 24B with the plural third wires 26.

Moreover, the determination section 507, when the detection value obtained by the output current sensor 34 at the time when the output current of the DC-DC converter 20 has been varied by the varying control section 506 is not 0 and the detection value relating to charging obtained by the charging/discharging voltage sensor 44 at the time when the output current of the DC-DC converter 20 has been varied by the varying control section 506 has not reached a predetermined value, determines that there is a fault in the auxiliary battery 22 in a case in which the diagnostic information obtained by the battery abnormality detection section 22A is information indicating a fault in the auxiliary battery 22 and otherwise determines that there is a disconnection fault in the battery-side segment 24Z of the second wire 24 that is a segment disposed on the auxiliary battery 22 side of all of the plural third wires 26.

The notification control section 508 controls the notification section 60 to notify the user of the residual capacity of the auxiliary battery 22 detected by the residual capacity detection section 46 when the detection value obtained by the output current sensor 34 at the time when the output current of the DC-DC converter 20 has been varied by the varying control section 506 is 0 and when the detection value relating to discharging obtained by the charging/discharging voltage sensor 44 at the time when the output current of the DC-DC converter 20 has been varied by the varying control section 506 is outside a predetermined range.

Figure 11A:
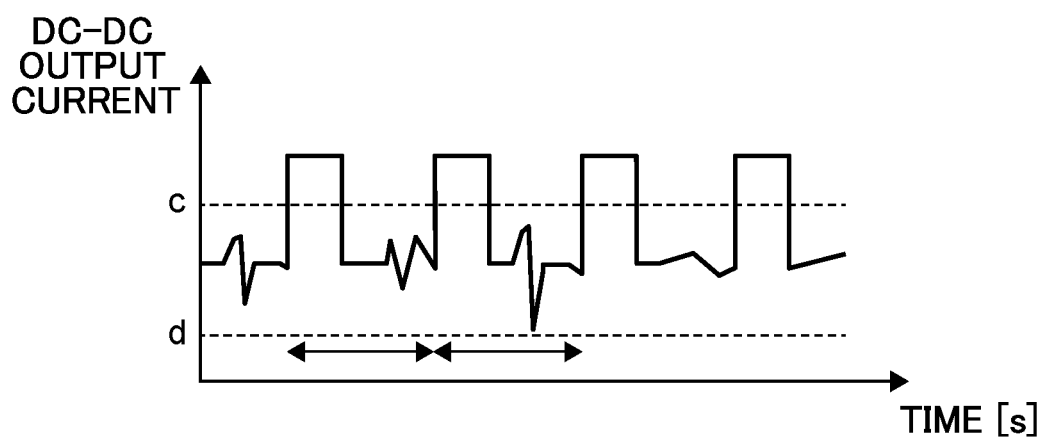
FIG. 11A is a graph illustrating an example of changes in an output current of the DC-DC converter during a diagnostic test.

Here, control to modify the output current of the DC-DC converter 20 (control for a diagnostic test) will be described with reference to FIG. 11A. In FIG. 11A, the vertical axis represents the output current (A) of the DC-DC converter 20 and the horizontal axis represents time (s). As illustrated in FIG. 11A, the output current (A) of the DC-DC converter 20 is periodically modulated for a short time (modulated and controlled for the diagnostic test). As an example, the DC-DC converter 20 is controlled in such a way that a square-wave pulse current is periodically generated. In the present exemplary embodiment, to enhance the accuracy of the disconnection fault range diagnosis, the pulse current is set to exceed a predetermined threshold value c. It will be noted that d in the drawing is a lower limit reference value and that the range from d to c in the drawing is to be understood as a float charging control current range.

It will be noted that in FIG. 11A the fluctuating parts of the parts outside the square waves are fluctuating parts caused by load fluctuations. Furthermore, in the present exemplary embodiment, as an example, the DC-DC converter 20 periodically generates a square-wave pulse current, but the DC-DC converter 20 may also periodically output a current having a characteristic waveform other than a square wave, such as a triangular wave or a sine wave, for example.

Next, the action of the present exemplary embodiment will be described.

Figure 10A:
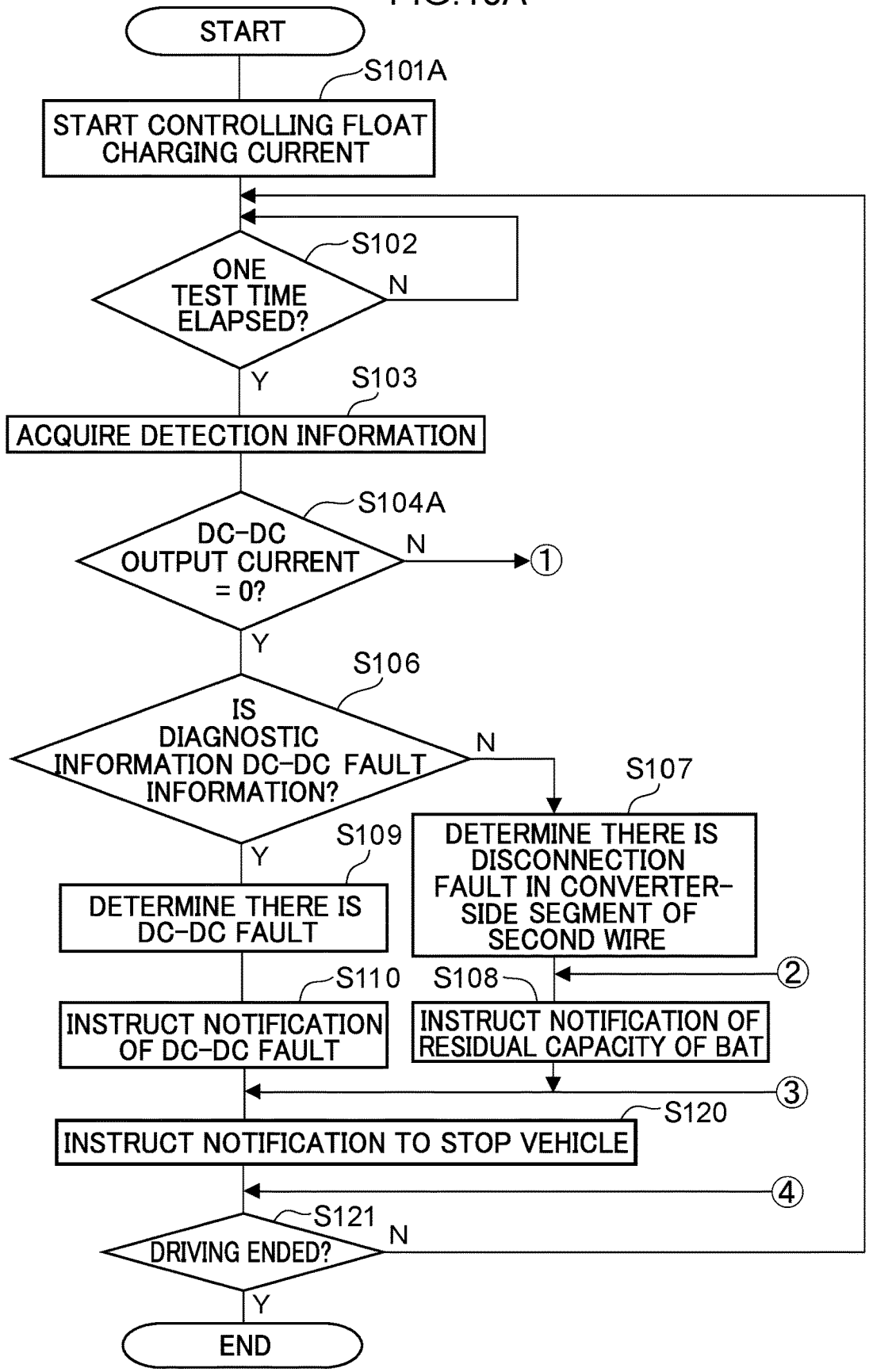
FIG. 10A is a flowchart illustrating an example of a flow of a control process executed by the power supply control ECU of FIG. 9.
Figure 10B:
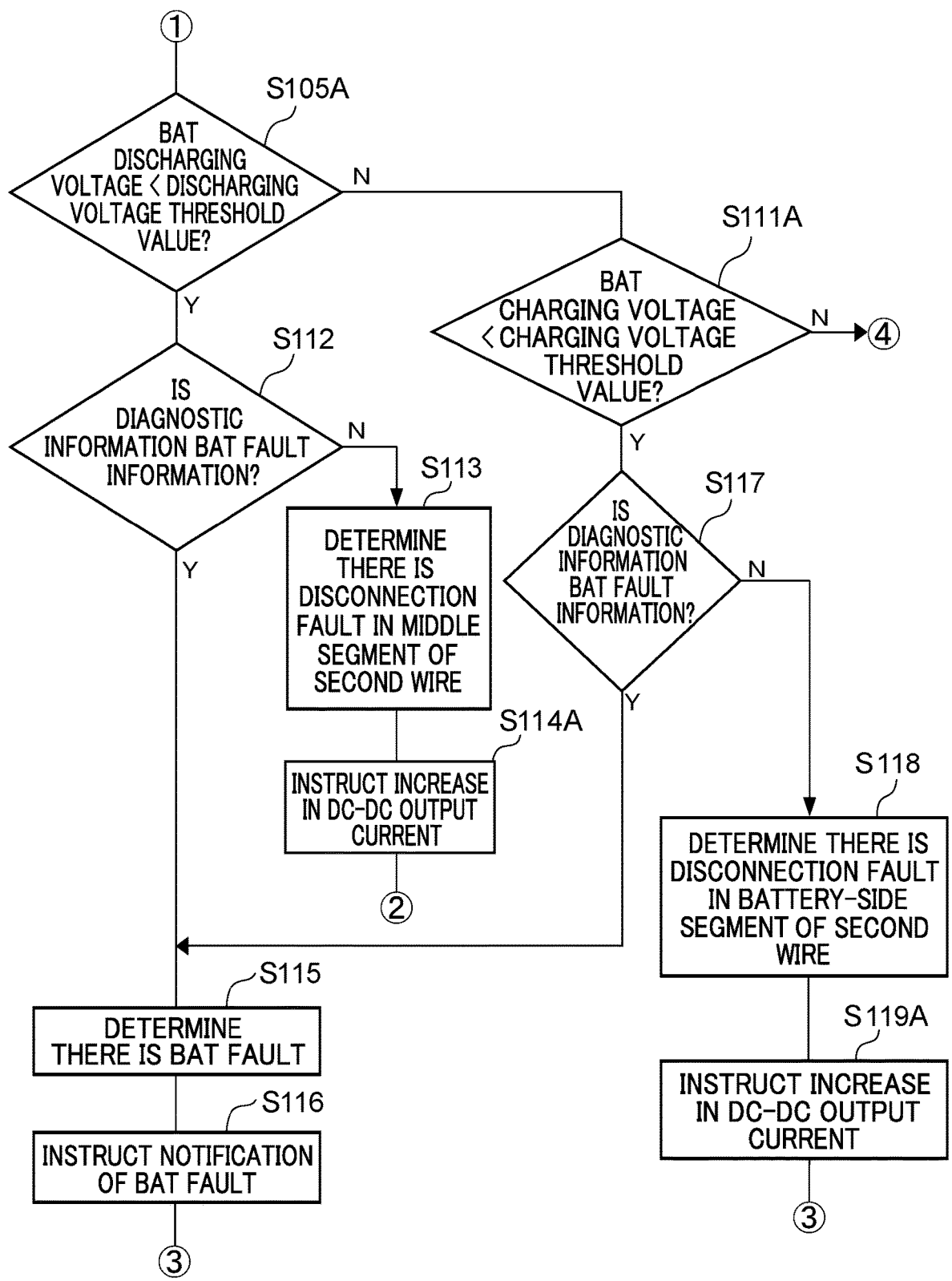
FIG. 10B is a continuation of the flowchart illustrated in FIG. 10A.

In FIG. 10A and FIG. 10B, an example of a flow of a control process executed by the power supply control ECU 50 of the present exemplary embodiment is illustrated in a flowchart. The control process executed by the power supply control ECU 50 of the present exemplary embodiment is performed by the CPU 50A reading the power supply control program of the present exemplary embodiment from the ROM 50B or the storage 50D, transferring it to the RAM 50C, and executing it. Execution of the control process illustrated in FIG. 10A and FIG. 10B is, as an example, started when the ignition switch of the vehicle is switched ON.

The flowchart illustrated in FIG. 10A and FIG. 10B is obtained by changing some steps in the flowchart illustrated in FIG. 7A and FIG. 7B described in the first exemplary embodiment. Steps illustrated in FIG. 10A and FIG. 10B obtained by changing the corresponding steps in FIG. 7A and FIG. 7B are denoted by the same reference signs but end in "A". It will be noted that description of the steps that are the same as those in the flowchart of the first exemplary embodiment (FIG. 7A and FIG. 7B) will be omitted as appropriate.

In step S101A illustrated in FIG. 10A, the CPU 50A starts controlling the float charging current and periodically modulates the output current of the DC-DC converter 20 for a short time. It will be noted that an example of a graph illustrating the relationship between the output current of the DC-DC converter 20 and time is illustrated in FIG. 11A.

Figure 11B:
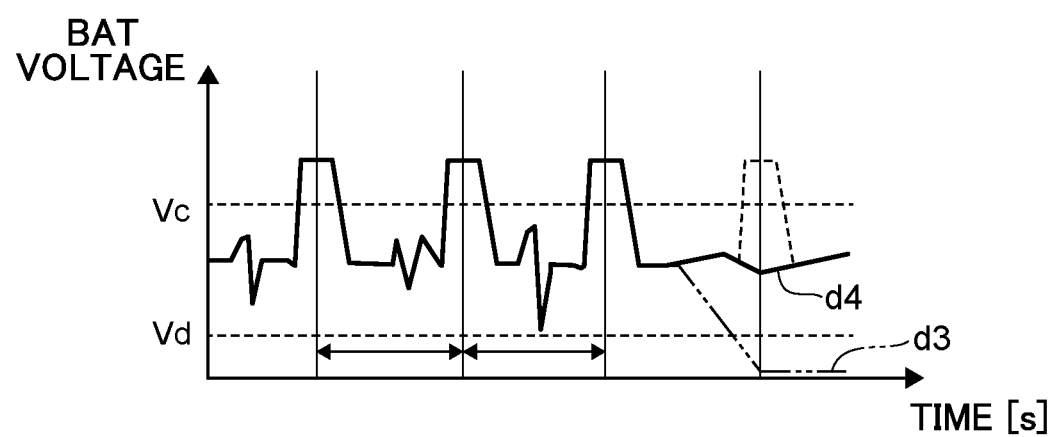
FIG. 11B is a graph illustrating an example of changes in a charging/discharging voltage of the auxiliary battery during the diagnostic test, with the dashed pulse wave on the right side in the drawing being a waveform in a normal case.

In step S102 after step S101A illustrated in FIG. 10A, the CPU 50A determines whether or not one diagnostic test time has elapsed. FIG. 11B illustrates an example of changes in the charging/discharging voltage value of the auxiliary battery 22 during the diagnostic test. In FIG. 11B, the horizontal axis represents time (s) and the vertical axis represents the charging/discharging voltage value (V) of the auxiliary battery 22. In the drawing, the double-headed arrows pointing right and left each indicate one diagnostic test time. One diagnostic test time corresponds to one current modulation cycle of the DC-DC converter 20.

Returning to the description of step S102 in FIG. 10A, in a case in which one diagnostic test time has not elapsed (step S102: N), the CPU 50A repeats the process of step S102, and in a case in which one diagnostic test time has elapsed (step S102: Y), the CPU 50A moves to the process of step S103.

In step S104A the CPU 50A determines whether or not the output current (A) of the DC-DC converter 20 is 0 (A). In a case in which the output current of the DC-DC converter is not 0 (A) (step S104A: N), the CPU 50A moves to the process of step S105A (see FIG. 10B). In a case in which the output current of the DC-DC converter 20 is 0 (A) (step S104A: Y), the CPU 50A moves to the process of step S106.

In step S105A illustrated in FIG. 10B, the CPU 50A determines whether or not the discharging voltage value of the auxiliary battery 22 is less than a discharging voltage threshold value Vd (see FIG. 11B). It will be noted that the discharging voltage threshold value Vd is a threshold value (a lower boundary value of a predetermined range) of the discharging voltage in the auxiliary battery 22 during the float charging control of the present exemplary embodiment, and is set based on the control responsiveness of the DC-DC converter 20 and the inrush current of the auxiliary loads 28 and 29.

In a case in which the discharging voltage value of the auxiliary battery 22 is less than the discharging voltage threshold value Vd (step S105A: Y; see the long dashed double-short dashed line denoted by reference sign d3 in FIG. 11B), the CPU 50A moves to the process of step S112. In a case in which the discharging voltage value of the auxiliary battery 22 is equal to or greater than the discharging voltage threshold value Vd (step S105A: N), the CPU 50A moves to the process of step S111A.

In a case in which the determination is negative in step S112 (step S112: N), the CPU 50A determines that there is a disconnection fault in the middle segment 24Y of the second wire 24 and stores the determination result in the storage 50D in step S113, ends the float charging control of the DC-DC converter 20 and instructs the DC-DC converter 20 to increase its output current so that power may be supplied to the auxiliary load 28 in step S114A, and then moves to the process of step S108 (see FIG. 10A).

In step S111A the CPU 50A determines whether or not the charging voltage value of the auxiliary battery 22 is less than a charging voltage threshold value Vc (see FIG. 11B). It will be noted that the charging voltage threshold value Vc is a threshold value of an upper limit of the charging voltage in the auxiliary battery 22 during the float charging control of the present exemplary embodiment, and is set based on the control responsiveness of the DC-DC converter 20. The range from the discharging voltage threshold value Vd to the charging voltage threshold value Vc illustrated in FIG. 11B is to be understood as a float charging control voltage range. Furthermore, in the present exemplary embodiment, to enhance the accuracy of the disconnection fault diagnosis, the maximum value of the charging voltage from the DC-DC converter 20 to the auxiliary battery 22 is intentionally made larger than the charging voltage threshold value Vc.

Returning to the description of step S111A of FIG. 10B, in a case in which the charging voltage value of the auxiliary battery 22 is not less than the charging voltage threshold value Vc (step S111A: N), the CPU 50A moves to the process of step S121 (see FIG. 10A). In a case in which the charging voltage value of the auxiliary battery 22 is less than the charging voltage threshold value Vc (step S111A: Y; see the part denoted by reference sign d4 in FIG. 11B), the CPU 50A moves to the process of step S117.

Furthermore, in step S119A the CPU 50A ends the float charging control of the DC-DC converter 20 and instructs the DC-DC converter 20 to increase its output current so that power may be supplied to the auxiliary loads 28 and 29. Thereafter, the CPU 50A moves to the process of step S120.

According also to the second exemplary embodiment described above, effects that are the same as those of the first exemplary embodiment are obtained.

[Supplemental Description of the Exemplary Embodiments]

In the flowcharts of the first and second exemplary embodiments illustrated in FIG. 7A, FIG. 7B, FIG. 10A, and FIG. 10B, in step S106 the CPU 50A determines whether or not the diagnostic information obtained by the converter abnormality detection section 20A is information indicating a fault in the DC-DC converter 20. However, as an example modification of the above exemplary embodiments, the flow may be changed to one where step S106 is omitted and, in a case in which the determination is affirmative in step S104 or S104A, the CPU 50A determines that there is a fault in the range from the DC-DC converter 20 to the converter-side segment 24X of the second wire 24, stores the determination result in the storage 50D, and moves to the process of step S120. Furthermore, as an example modification of that kind of flow, a step in which the CPU 50A instructs the notification section 60 to notify the user of the residual capacity of the auxiliary battery 22 may be provided after the CPU 50A stores the determination result in the storage 50D and before the CPU 50A moves to the process of step S120.

Furthermore, in the flowcharts of the first and second exemplary embodiments, in step S112 the CPU 50A determines whether or not the diagnostic information obtained by the battery abnormality detection section 22A is information indicating a fault in the auxiliary battery 22. However, the flow may also be changed to one where step S112 is omitted and, in a case in which the determination is affirmative in step S105 or S105A, the CPU 50A determines that there is either a disconnection fault in the middle segment 24Y of the second wire 24 or a fault in the auxiliary battery 22, stores the determination result in the storage 50D, and moves to the process of step S120 Furthermore, as an example modification of that kind of flow, one or both of a step in which the CPU 50A instructs the notification section 60 to notify the user of the residual capacity of the auxiliary battery 22 and a step in which the CPU 50A ends the float charging control of the DC-DC converter 20 and instructs the DC-DC converter 20 to increase its output voltage or output current may be provided after the CPU 50A stores the determination result in the storage 50D and before the CPU 50A moves to the process of step S120.

Furthermore, in the flowcharts of the first and second exemplary embodiments, in step S117 the CPU 50A determines whether or not the diagnostic information obtained by the battery abnormality detection section 22A is information indicating a fault in the auxiliary battery 22. However, the flow may also be changed to one where step S117 is omitted and, in a case in which the determination is affirmative in step S111 or S111A, the CPU 50A determines that there is either a disconnection fault in the battery-side segment 24Z of the second wire 24 or a fault in the auxiliary battery 22 (in other words, that there is a fault in the range from the battery-side segment 24Z of the second wire 24 to the auxiliary battery 22), stores the determination result in the storage 50D, and moves to the process of step S120. Furthermore, as an example modification of that kind of flow, a step in which the CPU 50A ends the float charging control of the DC-DC converter 20 and instructs the DC-DC converter 20 to increase its output voltage or output current may be provided after the CPU 50A stores the determination result in the storage 50D and before the CPU 50A moves to the process of step S120.

Furthermore, some of the steps in the flowchart of the second exemplary embodiment (see FIG. 10A and FIG. 10B) that differ from the steps in the flowchart of the first exemplary embodiment (see FIG. 7A and FIG. 7B) may also be replaced with steps in the flowchart of the first exemplary embodiment and implemented as appropriate. Specifically, for example, whether to control the float charging control using voltage or control the float charging control using current can be optionally chosen, and step S101A can be replaced with step S101 as appropriate. Furthermore, whether to determine the state of the output from the DC-DC converter 20 using the voltage value or determine the state of the output from the DC-DC converter 20 using the current value can be optionally chosen, and step S104A can be replaced with step S104 as appropriate. Furthermore, whether to determine the charging/discharging state of the auxiliary battery 22 using the current value or determine the charging/discharging state of the auxiliary battery 22 using the voltage value can be optionally chosen, step S105A can be replaced with step S105 as appropriate, and step S111A can be replaced with step S111 as appropriate. Furthermore, whether the CPU 50A performs control to increase the output voltage of the DC-DC converter 20 or performs control to increase the output current of the DC-DC converter 20 after the CPU 50A has determined that there is a disconnection fault in the middle segment 24Y of the second wire 24 (step S113) can be optionally chosen, and step S114A can be replaced with step S114 as appropriate. Moreover, whether the CPU 50A performs control to increase the output voltage of the DC-DC converter 20 or performs control to increase the output current of the DC-DC converter 20 after the CPU 50A has determined that there is a disconnection fault in the battery-side segment 24Z of the second wire 24 (step S1118) can be optionally chosen, and step S119A can be replaced with step S119 as appropriate.

Furthermore, it goes without saying that, to enhance detection accuracy, setting conditions may be changed and implemented as appropriate, such as increasing the number of detections per section of time by each detection section, and/or increasing the amplitude of the waveform the during diagnostic test, and/or increasing the threshold value of charging/discharging.

Furthermore, in the flowcharts of the first and second exemplary embodiments, process steps after the CPU 50A has determined the faulty part can be set as appropriate. For example, in a case in which the vehicle in which the power supply system 10 is installed is an autonomous driving vehicle, instead of step S120 (instructing the notification section 60 to notify the user that the vehicle should be stopped), a step in which the CPU 50A instructs an autonomous driving ECU to stop the vehicle at a predetermined timing and instructs the notification section 60 to notify the user that the vehicle will stop may be provided. Furthermore, for example, after step S119 or S119A, a step in which the CPU 50A determines whether or not the output power of the DC-DC converter 20 is sufficient may be provided, and in a case in which the output power of the DC-DC converter 20 is sufficient, the CPU 50A may repeat the process of this step, and in a case in which the output power of the DC-DC converter 20 is not sufficient, the CPU 50A may move to the process of step S120.

Each process that the CPU 50A illustrated in FIG. 2 executed by reading software (programs) in each of the above exemplary embodiments may also be executed by various types of processors other than a CPU. Examples of processors in this case include programmable logic devices (PLDs) whose circuit configuration can be changed after manufacture, such as field-programmable gate arrays (FPGAs), and dedicated electrical circuits that are processors having a circuit configuration dedicatedly designed for executing specific processes, such as application-specific integrated circuits (ASICs). Furthermore, each process may be executed by one of these various types of processors or may be executed by a combination of two or more processors of the same type or different types (e.g., plural FPGAs, and a combination of a CPU and an FPGA, etc.). Furthermore, the hardware structures of these various types of processors are more specifically electrical circuits in which circuit elements such as semiconductor elements are combined.

Furthermore, each program described in the above exemplary embodiments may also be provided in a form in which it is recorded in a recording medium such as a compact disc read-only memory (CD-ROM), a digital versatile disc read-only memory (DVD-ROM), and a universal serial bus (USB) memory. Furthermore, the programs may also take a form in which they are downloaded via a network from an external device.

The above exemplary embodiments and the above example modifications can also be combined and implemented as appropriate.

Examples of the disclosure have been described above, but the disclosure is not limited to what is described above and of course can also be modified and implemented in various ways, in addition to what is described above, in a range that does not depart from the spirit thereof.

What is claimed is:

1. A power supply system comprising:
   a first battery;

a second battery having a voltage lower than the first battery;

a DC-DC converter electrically connected to the first battery using a first wire, and electrically connected to the second battery using a second wire, the DC-DC converter stepping down and outputting to the second wire the output voltage of the first battery;

a plurality of loads that are electrically connected in parallel with the second battery to the DC-DC converter using a plurality of third wires;

an output detector that detects an output voltage or an output current of the DC-DC converter;

a charging/discharging detector that detects a charging/discharging voltage or a charging/discharging current of the second battery;

a varying control section that varies one of the output voltage and the output current of the DC-DC converter; and a determination section that:

in a case in which a detection value, obtained by the output detector at a time when one of the output voltage or the output current of the DC-DC converter has been varied by the varying control section, is 0, determines that there is a fault in a range from the DC-DC converter to a converter-side segment of the second wire, which is a segment disposed on the DC-DC converter side of all of the plurality of third wires, and in a case in which the detection value, obtained by the output detector at a time when one of the output voltage or the output current of the DC-DC converter has been varied by the varying control section, is not 0, determines whether or not there is a fault based on a detection result obtained by the charging/discharging detector at the time when the one of the output voltage or the output current of the DC-DC converter has been varied by the varying control section, and, in a case in which it determines that there is a fault, determines a fault range from a range from a segment of the second wire outside the converter-side segment to the second battery.

2. The power supply system of claim 1, wherein:

the DC-DC converter includes a converter abnormality detection section that self-diagnoses whether or not operation of the DC-DC converter itself is normal and generates diagnostic information indicating the diagnostic result, and the determination section, in a case in which the detection value, obtained by the output detector at the time when one of the output voltage or the output current of the DC-DC converter has been varied by the varying control section, is 0, determines that there is a fault in the DC-DC converter in a case in which the diagnostic information obtained by the converter abnormality detection section is information indicating a fault in the DC-DC converter and otherwise determines that there is a disconnection fault in the converter-side segment of the second wire.

3. The power supply system of claim 1, wherein:

the second battery includes a battery abnormality detection section that self-diagnoses whether or not operation of the second battery itself is normal and generates diagnostic information indicating the diagnostic result, and in a case in which the detection value, obtained by the output detector at the time when one of the output voltage or the output current of the DC-DC converter has been varied by the varying control section, is not 0 and a detection value relating to discharging obtained by the charging/discharging detector at the time when the one of the output voltage or the output current of the DC-DC converter has been varied is outside a predetermined range, the determination section determines that there is a fault in the second battery in a case in which the diagnostic information obtained by the battery abnormality detection section is information indicating a fault in the second battery and otherwise determines that there is a disconnection fault in a segment of the second wire located between junctions with the plurality of third wires.

4. The power supply system of claim 1, wherein:

the second battery includes a battery abnormality detection section that self-diagnoses whether or not operation of the second battery itself is normal and generates diagnostic information indicating the diagnostic result, and in a case in which the detection value, obtained by the output detector at the time when one of the output voltage or the output current of the DC-DC converter has been varied by the varying control section, is not 0 and a detection value relating to charging obtained by the charging/discharging detector at the time when the one of the output voltage or the output current of the DC-DC converter has been varied has not reached a predetermined value, the determination section determines that there is a fault in the second battery in a case in which the diagnostic information obtained by the battery abnormality detection section is information indicating a fault in the second battery and otherwise determines that there is a disconnection fault in a segment of the second wire disposed on the second battery side of all of the plurality of third wires.

5. The power supply system of claim 1, further comprising:

a notification section that notifies a user of information;

a residual capacity detection section that detects the residual capacity of the second battery; and a notification control section that controls the notification section to notify the user of the residual capacity of the second battery detected by the residual capacity detection section in a case in which the detection value, obtained by the output detector at the time when one of the output voltage or the output current of the DC-DC converter has been varied by the varying control section, is 0 and in a case in which the detection value relating to discharging obtained by the charging/discharging detector at the time when the one of the output voltage or the output current of the DC-DC converter has been varied is outside a predetermined range.

6. The power supply system of claim 1, wherein the varying control section performs control to increase the output voltage or the output current of the DC-DC converter in a case in which the detection value, obtained by the output detector at the time when one of the output voltage or the output current of the DC-DC converter has been varied, is not 0 and the detection value relating to discharging obtained by the charging/discharging detector at the time when the one has been varied is outside a predetermined range.

7. The power supply system of claim 1, wherein the varying control section performs control to increase the output voltage or the output current of the DC-DC converter in a case in which the detection value, obtained by the output detector at the time when one of the output voltage or the output current of the DC-DC converter has been varied, is not 0 and the detection value relating to charging obtained by the charging/discharging detector at the time when the one has been varied has not reached a predetermined value.

* * * * *